US011502195B2

(12) United States Patent
Wang et al.

(10) Patent No.: US 11,502,195 B2
(45) Date of Patent: Nov. 15, 2022

(54) SEMICONDUCTOR STRUCTURE AND MANUFACTURING METHOD THEREOF

(71) Applicant: Nuvoton Technology Corporation, Hsinchu (TW)

(72) Inventors: Ching-San Wang, Hsinchu (TW); Kuang-Chu Chen, Hsinchu (TW); Peng-Chan Hsiao, Hsinchu (TW); Han-Ying Liu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 148 days.

(21) Appl. No.: 17/010,846

(22) Filed: Sep. 3, 2020

(65) Prior Publication Data
US 2021/0202739 A1 Jul. 1, 2021

(30) Foreign Application Priority Data
Dec. 26, 2019 (TW) .................................. 108147941

(51) Int. Cl.
*H01L 29/78* (2006.01)
*H01L 29/20* (2006.01)
*H01L 29/66* (2006.01)
*H01L 21/02* (2006.01)
*H01L 29/423* (2006.01)

(52) U.S. Cl.
CPC ...... *H01L 29/7842* (2013.01); *H01L 21/0254* (2013.01); *H01L 29/2003* (2013.01); *H01L 29/4236* (2013.01); *H01L 29/66734* (2013.01); *H01L 29/7813* (2013.01)

(58) Field of Classification Search
CPC ............. H01L 29/7842; H01L 29/0254; H01L 29/2003; H01L 29/4236; H01L 29/66734; H01L 29/7813
USPC .......................................................... 257/76
See application file for complete search history.

(56) References Cited

U.S. PATENT DOCUMENTS

| 6,294,801 B1 * | 9/2001 | Inokuchi ........... H01L 29/42316 |
| | | 257/E29.127 |
| 6,391,770 B2 * | 5/2002 | Kosaki ............. H01L 21/76898 |
| | | 438/650 |
| 2008/0261403 A1 | 10/2008 | Wang et al. |
| 2011/0159615 A1 | 6/2011 | Lai |
| 2013/0161643 A1 * | 6/2013 | Crowder ............... H01L 33/007 |
| | | 257/77 |
| 2018/0012770 A1 * | 1/2018 | Macelwee ........... C01B 21/0632 |

OTHER PUBLICATIONS

"Office Action of Taiwan Counterpart Application", dated Oct. 27, 2020, p. 1-p. 6.

* cited by examiner

*Primary Examiner* — Igwe U Anya
(74) *Attorney, Agent, or Firm* — JCIPRNET

(57) ABSTRACT

A semiconductor structure and a manufacturing method of the semiconductor structure are provided. The semiconductor structure includes a substrate and a III-V group compound layer disposed on the substrate. The III-V group compound layer has n trenches vertically communicating with each other, and n≥2. Widths of the n trenches gradually decrease from the width of the uppermost first trench to the width of the lowermost $n^{th}$ trench, and the $n^{th}$ trench exposes a portion of the substrate.

19 Claims, 6 Drawing Sheets

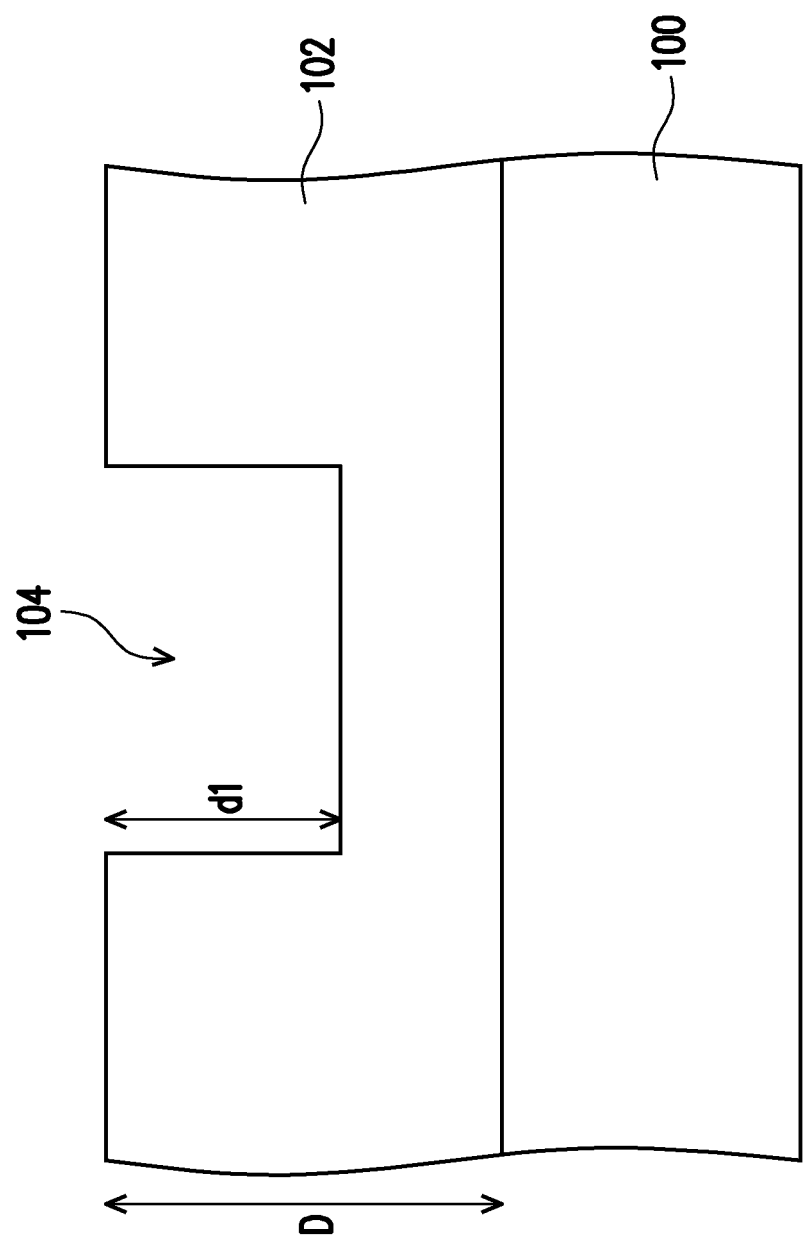

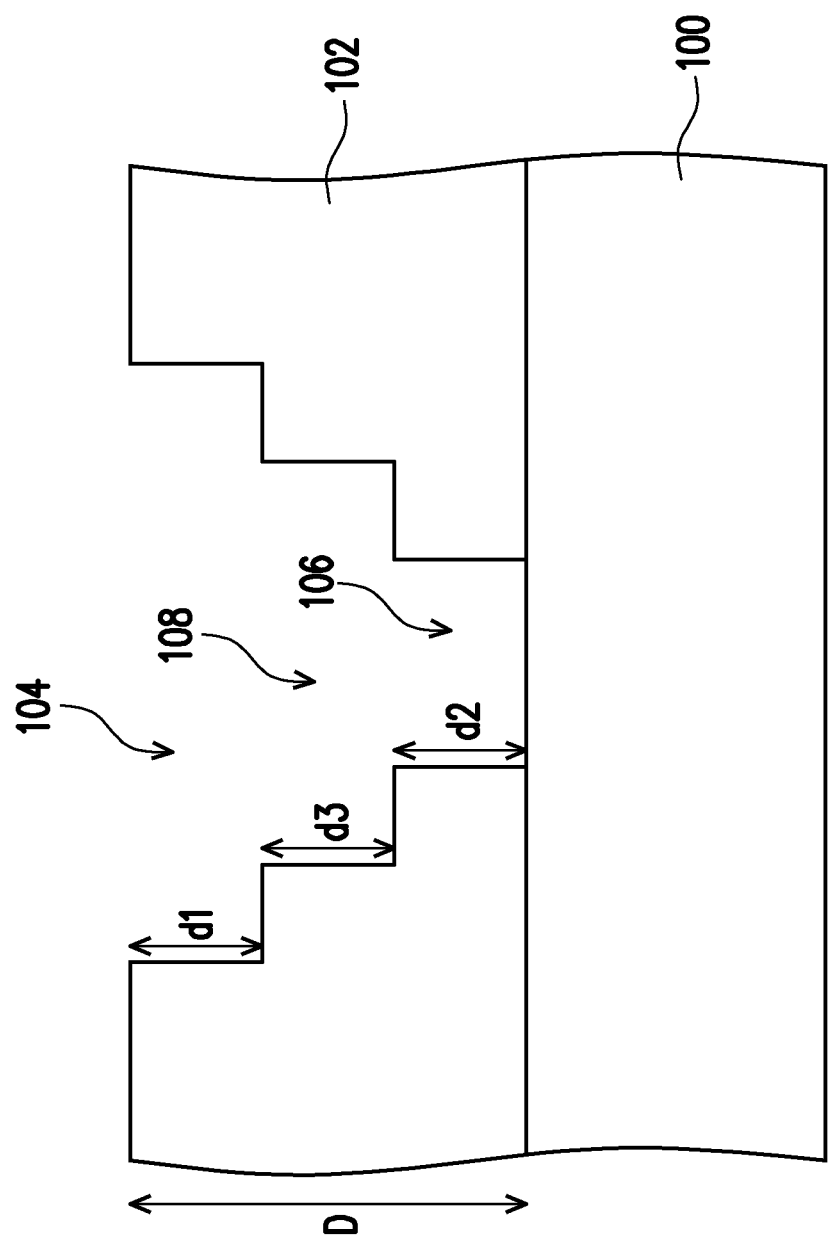

SEMICONDUCTOR STRUCTURE AND MANUFACTURING METHOD THEREOF

CROSS-REFERENCE TO RELATED APPLICATION

This application claims the priority benefit of Taiwan patent application serial no. 108147941, filed on Dec. 26, 2019. The entirety of the above-mentioned patent application is hereby incorporated by reference herein and made a part of this specification.

BACKGROUND

Technical Field

The disclosure relates to a semiconductor structure and a manufacturing method thereof; more particularly, the disclosure relates to a semiconductor structure capable of releasing stress between a III-V group compound layer and a substrate and a manufacturing method of the semiconductor structure.

Description of Related Art

III-V group compounds, characterized by high energy gap, high thermal conductivity, and chemical stability, have been actively researched and widely used in high electron mobility transistors (HEMT), Schottky barrier diode (SBD), and other components.

However, after a III-V group compound layer is epitaxially grown on a silicon substrate, due to the lattice mismatch between the III-V group compound layer and the silicon substrate, stress is generated at a junction between the III-V group compound layer and the silicon substrate, which easily leads to damages to the resultant structure.

SUMMARY

The disclosure provides a semiconductor structure which can release stress between a III-V group compound layer and a substrate.

The disclosure provides a manufacturing method of a semiconductor structure for manufacturing the above-mentioned semiconductor structure.

According to an embodiment of the disclosure, a semiconductor structure including a substrate and a III-V group compound layer disposed on the substrate is provided. The III-V group compound layer has n trenches vertically communicating with each other, and $n \geq 2$. Widths of the n trenches gradually decrease from the width of the uppermost first trench to the width of the lowermost $n^{th}$ trench, and the $n^{th}$ trench exposes a portion of the substrate.

In an embodiment of the disclosure, the $n^{th}$ trench exposes a surface of the substrate.

In an embodiment of the disclosure, the $n^{th}$ trench extends into the substrate.

In an embodiment of the disclosure, an angle between a sidewall of each of the n trenches and a surface of the substrate ranges from 30° to 90°.

In an embodiment of the disclosure, the n trenches have a total depth D, and a depth of each of the n trenches is within a range of $D/n \pm 50\%$.

In an embodiment of the disclosure, the III-V group compound layer includes a gallium nitride layer.

In an embodiment of the disclosure, the n trenches form a staircase structure.

In an embodiment of the disclosure, sidewalls of the n trenches are all perpendicular to a plane where the substrate is located.

In an embodiment of the disclosure, sidewalls of the n trenches are inclined sidewalls.

In an embodiment of the disclosure, the substrate includes a silicon substrate.

According to an embodiment of the disclosure, a manufacturing method of a semiconductor structure includes following steps: providing a substrate; forming a III-V group compound layer on the substrate; and sequentially forming n trenches vertically communicating with each other in the III-V group compound layer, wherein $n \geq 2$. Widths of the n trenches gradually decrease from the width of the uppermost first trench to the width of the lowermost $n^{th}$ trench, and the $n^{th}$ trench exposes a portion of the substrate.

In an embodiment of the disclosure, the $n^{th}$ trench exposes a surface of the substrate.

In an embodiment of the disclosure, the $n^{th}$ trench extends into the substrate.

In an embodiment of the disclosure, an angle between a sidewall of each of the n trenches and a surface of the substrate ranges from 30° to 90°.

In an embodiment of the disclosure, the n trenches have a total depth D, and a depth of each of the n trenches is within a range of $D/n \pm 50\%$.

In an embodiment of the disclosure, the III-V group compound layer includes a gallium nitride layer.

In an embodiment of the disclosure, the n trenches are formed in an order from the first trench to the $n^{th}$ trench.

In an embodiment of the disclosure, the n trenches form a staircase structure.

In an embodiment of the disclosure, sidewalls of the n trenches are all perpendicular to a plane where the substrate is located.

Based on the above, according to one or more embodiments of the disclosure, a plurality of trenches communicating with each other are formed in the III-V group compound layer, and the lowermost trench exposes a portion of the substrate; that is, the trenches penetrate the III-V group compound layer, so that the stress between the III-V group compound layer and the substrate may be effectively released.

In order to make the aforementioned features and advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 1A to FIG. 1C are schematic cross-sectional views illustrating a manufacturing process of a semiconductor structure according to an embodiment of the disclosure.

FIG. 4 is a schematic cross-sectional view of a semiconductor structure according to another embodiment of the disclosure.

DESCRIPTION OF THE EMBODIMENTS

Figure 1A:
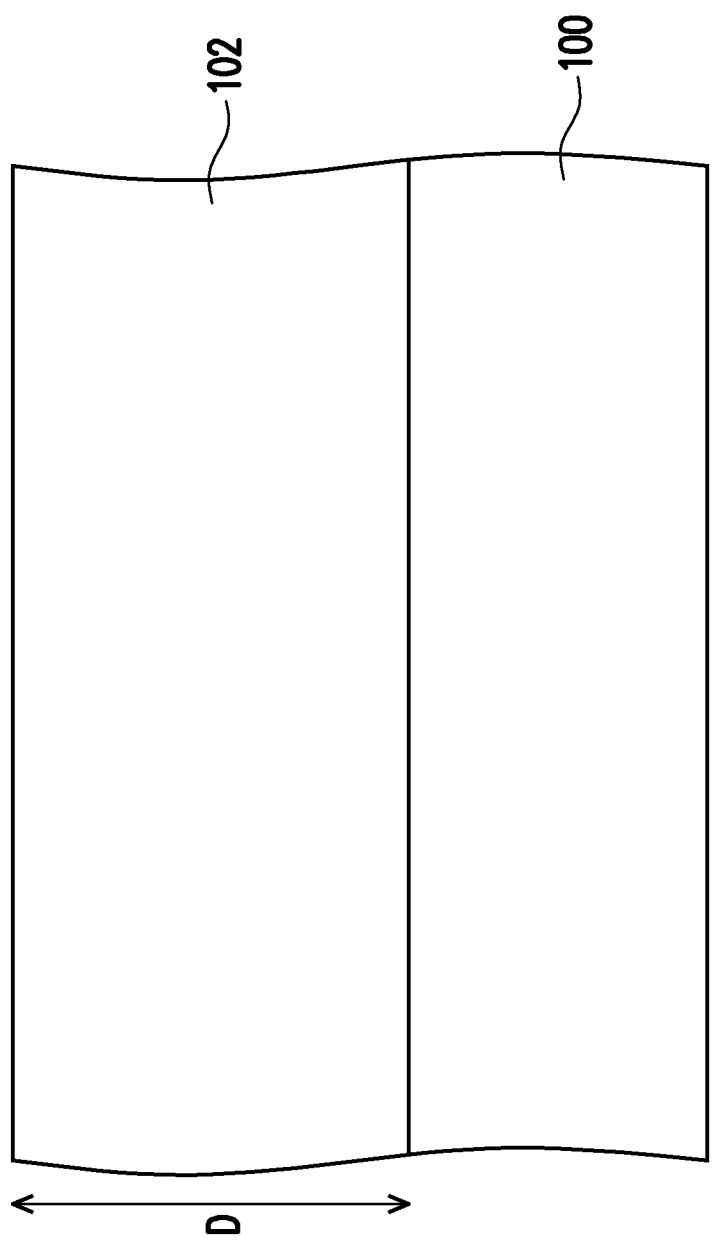
Figure 1C:
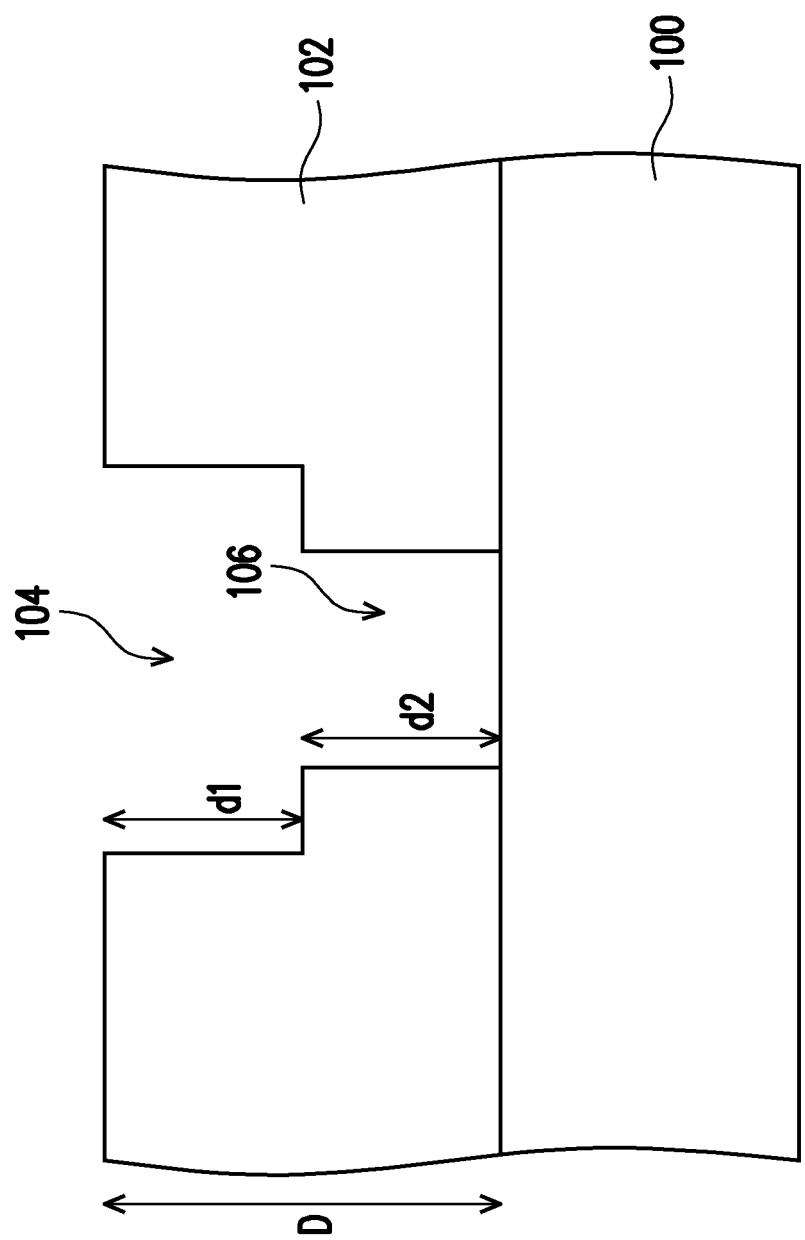

FIG. 1A to FIG. 1C are schematic cross-sectional views illustrating a manufacturing process of a semiconductor structure according to an embodiment of the disclosure. With reference to FIG. 1A, a substrate 100 is provided. The substrate 100 is, for instance, a silicon substrate. A III-V group compound layer 102 is formed on the substrate 100. The III-V group compound layer 102 is, for instance, a gallium nitride layer. The III-V group compound layer 102 is formed by, for instance, an epitaxial growth process. In the embodiment, the III-V group compound layer 102 has a thickness D. Besides, the III-V group compound layer 102 provided in this embodiment has a single-layer structure, which should however not be construed as a limitation in the disclosure. In other embodiments, the III-V group compound layer 102 may have a multi-layer structure.

After the III-V group compound layer 102 is formed on the substrate 100, due to the lattice mismatch between the III-V group compound layer 102 and the substrate 100, stress is generated at a junction between the III-V group compound layer 102 and the substrate 100. As such, the subsequently formed components are easily damaged by the stress. In particular, when the above-mentioned issues arise in a main component region in a wafer, the entire wafer is often scrapped, and the production cost is increased. Therefore, the stress resulting from lattice mismatch is intended to be released in one or more embodiments of the disclosure, which will be described in detail below.

With reference to FIG. 1B, a first trench 104 is formed in the III-V group compound layer 102. The bottom of the first trench 104 is located in the III-V group compound layer 102; namely, the first trench 104 does not penetrate the III-V group compound layer 102. In this embodiment, the first trench 104 has a depth d1 and is formed by, for instance, a patterning process. Detailed steps are well known to those skilled in the art and thus are not described herein.

With reference to FIG. 1C, a second trench 106 is formed in the III-V group compound layer 102 exposed by the bottom of the first trench 104. In this embodiment, the second trench 106 exposes a surface of the substrate 100; that is, the first trench 104 and the second trench 106 penetrate the III-V group compound layer 102. A method of forming the second trench 106 is, for instance, a patterning process. Detailed steps are well known to those skilled in the art and thus are not described herein. The second trench 106 has a depth d2. That is, in this embodiment, the sum of the depth d1 of the first trench 104 and the depth d2 of the second trench 106 is a thickness D of the III-V group compound layer 102. In addition, since the second trench 106 is formed in the III-V group compound layer 102 exposed by the bottom of the first trench 104, a width of the second trench 106 is smaller than a width of the first trench 104. As such, sidewalls of the first trench 104 and the second trench 106 may form a staircase structure, which may prevent residues of a subsequently formed metal layer. Further explanations will be provided hereinafter.

In this embodiment, since the first trench 104 and the second trench 106 formed in the III-V group compound layer 102 penetrate the III-V group compound layer 102, the stress resulting from the lattice mismatch between the III-V group compound layer 102 and the substrate 100 may be effectively released, and the subsequently formed components may be protected from being damaged by the stress.

In this embodiment, the first trench 104 with a larger width is formed before the III-V group compound layer 102 is formed, and the second trench 106 with a smaller width is formed, so as to prevent misalignment of the first trench 104 and the second trench 106. If the second trench 106 with a smaller width is formed first, and then the first trench 104 with a larger width is formed, it is not easy to form the first trench 104 at a desired position because the size of the second trench 106 is small.

In addition, in this embodiment, the depth d1 of the first trench 104 and the depth d2 of the second trench 106 are respectively half the sum (the thickness D in this embodiment) of the depth d1 of the first trench 104 and the depth d2 of the second trench 106 of the III-V group compound layer 102, which should however not be construed as a limitation in the disclosure, given that the depth d1 of the first trench 104 and the depth d2 of the second trench 106 are each within a range of (half the sum of the depth d1 and the depth d2)±50%. In other words, when two trenches are formed in the III-V group compound layer 102, the depth of each trench is within a range of (the sum of depth d1 and depth d2)/2±50%.

The sidewalls of the two trenches in the III-V group compound layer 102 have a staircase structure, and the depth d1 and the depth d2 are each within a range of (half the sum of the depth d1 and the depth d2)±50%; therefore, when a film layer is subsequently formed on the III-V group compound layer 102 and covers the staircase structure, the film layer on the staircase structure may be easily and completely removed through an etching process, so as to avoid residues on the staircase structure. In particular, when the film layer is a metal layer, if the metal layer is still left on the staircase structure after the etching process is performed, an induced current may be generated at the remaining metal layer during the operation of other components (especially high-voltage components), which may pose a negative impact on the performance of the components.

In this embodiment, the second trench 106 exposes the surface of the substrate 100, which should however not be construed as a limitation in the disclosure. In other embodiments, the second trench 106 may also extend into the substrate 100, which will be described hereinafter.

Figure 2:
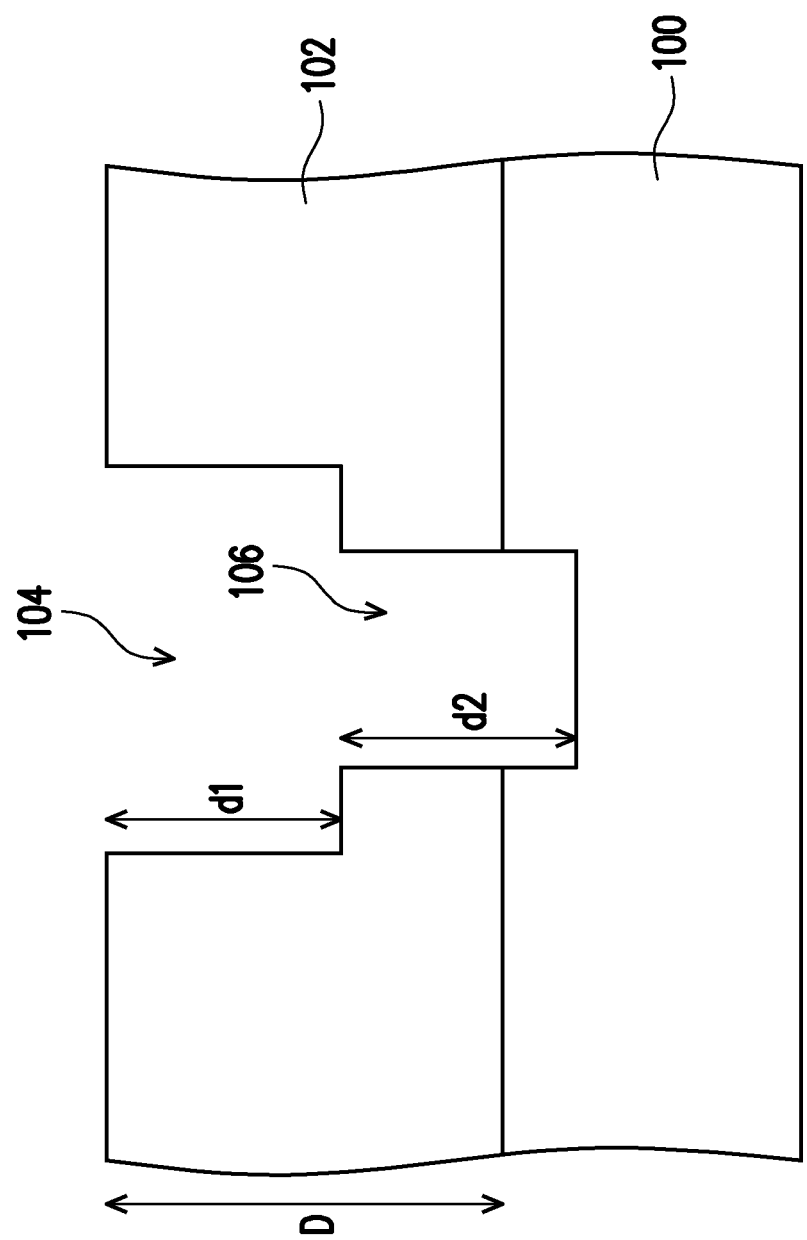
FIG. 2 is a schematic cross-sectional view of a semiconductor structure according to another embodiment of the disclosure.

FIG. 2 is a schematic cross-sectional view of a semiconductor structure according to another embodiment of the disclosure. In this embodiment, the same components as those in FIG. 1 will be represented by the same numeral numbers or symbols and will not be described again.

As shown in FIG. 2, in this embodiment, the second trench 106 extends into the substrate 100. At this time, since two trenches are formed in the III-V group compound layer 102, each of the depth d1 of the first trench 104 and the depth d2 of the second trench 106 is still within a range of (the sum of the depth d1 and the depth d2)/2±50%.

That is, no matter whether the second trench 106 exposes the surface of the substrate 100 or extends into the substrate 100, the depth d1 of the first trench 104 and the depth d2 of the second trench 106 is each required to fall within a range of (the sum of the depth d1 and the depth d2)/2±50%, so as to effectively avoid the film layer from remaining on the staircase structure formed by the first trench 104 and the second trench 106 in subsequent processes.

In addition, in the above embodiments, the sidewalls of the first trench 104 and the second trench 106 are perpendicular to a plane where the substrate 100 is located, which should however not be construed as a limitation in the disclosure.

Figure 3:
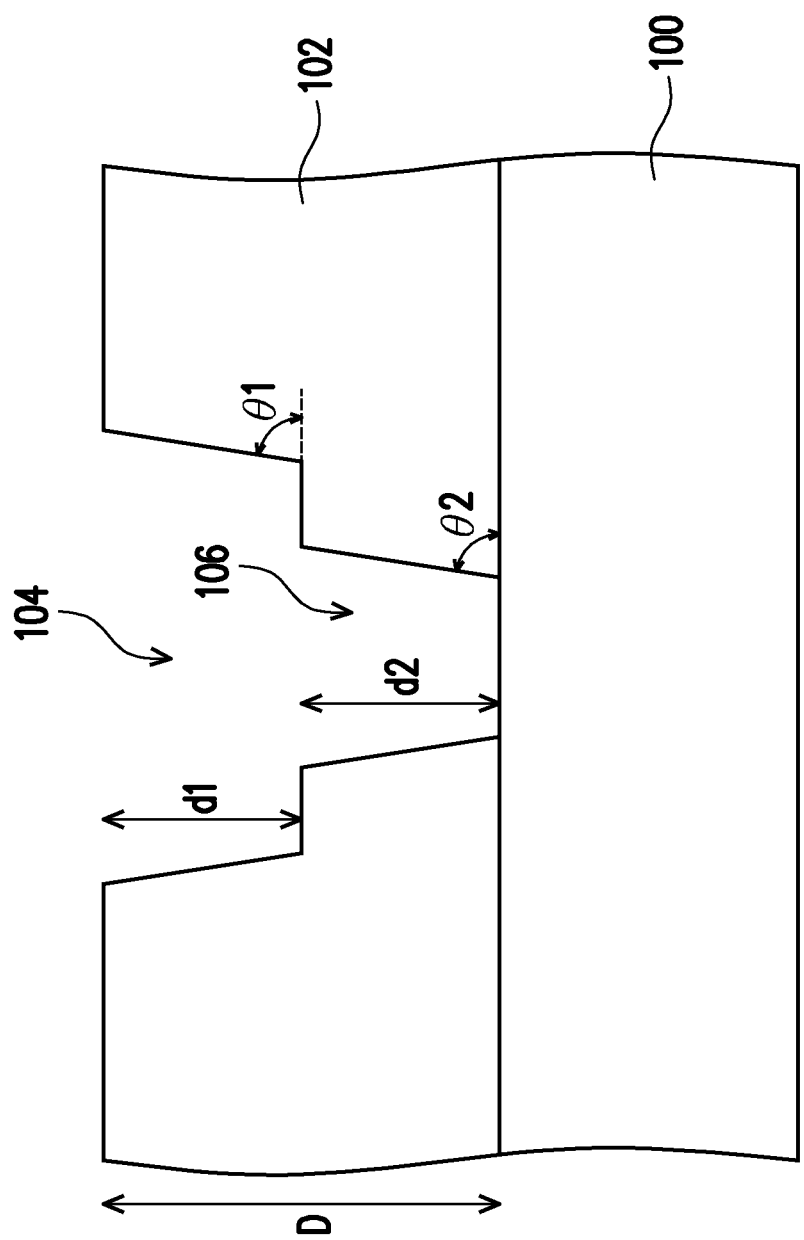
FIG. 3 is a schematic cross-sectional view of a semiconductor structure according to another embodiment of the disclosure.

FIG. 3 is a schematic cross-sectional view of a semiconductor structure according to another embodiment of the disclosure. In this embodiment, the same components as those in FIG. 1 will be represented by the same numeral numbers or symbols and will not be described again.

With reference to FIG. 3, in this embodiment, an angle θ1 between the sidewall of the first trench 104 and the surface of the substrate 100 ranges from 30° to 90°, and an angle θ2 between the sidewall of the second trench 106 and the surface of the substrate 100 ranges from 30° to 90°. That is, both the first trench 104 and the second trench 106 have inclined sidewalls. When the first trench 104 and the second trench 106 both have the inclined sidewalls, the subsequently formed film layer may be better prevented from remaining on the staircase structure formed by the first trench 104 and the second trench 106 in subsequent processes.

In the event that the first trench 104 and the second trench 106 have the inclined sidewalls, the second trench 106 may also expose the surface of the substrate 100 or extend into the substrate 100 (as shown in FIG. 2).

In the previous embodiments, two trenches are formed in the III-V group compound layer 102, which should however not be construed as a limitation in the disclosure. In other embodiments, more trenches may be formed in the III-V group compound layer 102 according to actual requirements.

FIG. 4 is a schematic cross-sectional view of a semiconductor structure according to another embodiment of the disclosure. In this embodiment, the same components as those in FIG. 1 will be represented by the same numeral numbers or symbols and will not be described again.

With reference to FIG. 4, in this embodiment, the first trench 104, the second trench 106, and a third trench 108 are formed in the III-V group compound layer 102, and the third trench 108 is located between the first trench 104 and the second trench 106. A width of the third trench 108 is smaller than the width of the first trench 104 and larger than the width of the second trench 106. In other words, widths of the n trenches gradually decrease from the width of the uppermost first trench to the width of the lowermost $n^{th}$ trench. In addition, the second trench 106 exposes the surface of the substrate 100; that is, the first trench 104, the second trench 106, and the third trench 108 penetrate the III-V group compound layer 102. Since the first trench 104, the second trench 106, and the third trench 108 formed in the III-V group compound layer 102 penetrate the III-V group compound layer 102, the stress resulting from the lattice mismatch between the III-V group compound layer 102 and the substrate 100 may be effectively released, and the subsequently formed components may be protected from being damaged by the stress.

In addition, in this embodiment, three trenches are formed in the III-V group compound layer 102, and therefore the depth of each of the three trenches is within a range of (the sum of the depths of the three trenches)/3±50%. That is, the depth d1 of the first trench 104, the depth d2 of the second trench 106, and a depth d3 of the third trench 108 are each within a range of (the sum of the depth d1, the depth d2, and the depth d3)/3±50%, so as to effectively prevent the film layer from remaining on the staircase structure formed by the first trench 104, the second trench 106, and the third trench 108 in subsequent processes.

Similarly, in other embodiments, the first trench 104, the second trench 106, and the third trench 108 may all have inclined sidewalls, and the second trench 106 may also extend into the substrate 100 (as shown in FIG. 2).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:
   a substrate; and
   a III-V group compound layer, disposed on the substrate, wherein the III-V group compound layer has n trenches vertically communicating with each other, and n≥2, wherein widths of the n trenches gradually decrease from the width of the uppermost first trench to the width of the lowermost $n^{th}$ trench;
   wherein the $n^{th}$ trench exposes a portion of the substrate, and
   wherein the n trenches have a total depth D, and a depth of each of the n trenches is within a range of D/n±50%.

2. The semiconductor structure according to claim 1, wherein the $n^{th}$ trench exposes a surface of the substrate.

3. The semiconductor structure according to claim 1, wherein the $n^{th}$ trench exposes a portion of the substrate and extends into the substrate.

4. The semiconductor structure according to claim 1, wherein an angle between a sidewall of each of the n trenches and a surface of the substrate ranges from 30° to 90°.

5. The semiconductor structure according to claim 1, wherein the III-V group compound layer comprises a gallium nitride layer.

6. The semiconductor structure according to claim 1, wherein the n trenches form a staircase structure.

7. The semiconductor structure according to claim 1, wherein sidewalls of the n trenches are all perpendicular to a plane where the substrate is located.

8. The semiconductor structure according to claim 1, wherein sidewalls of the n trenches are inclined sidewalls.

9. The semiconductor structure according to claim 1, wherein the substrate comprises a silicon substrate.

10. The semiconductor structure according to claim 1, wherein the n trenches penetrate the III-V group compound layer.

11. A manufacturing method of a semiconductor structure, comprising:
    providing a substrate;
    forming a III-V group compound layer on the substrate; and
    sequentially forming n trenches vertically communicating with each other in the III-V group compound layer, wherein widths of the n trenches gradually decrease from the width of the uppermost first trench to the width of the lowermost $n^{th}$ trench, the $n^{th}$ trench exposes a portion of the substrate, and n≥2, and
    wherein the n trenches have a total depth D, and a depth of each of the n trenches is within a range of D/n±50%.

12. The manufacturing method according to claim 11, wherein the $n^{th}$ trench exposes a surface of the substrate.

13. The manufacturing method according to claim 11, wherein the $n^{th}$ trench extends into the substrate.

14. The manufacturing method according to claim 11, wherein an angle between a sidewall of each of the n trenches and a surface of the substrate ranges from 30° to 90°.

15. The manufacturing method according to claim 11, wherein the III-V group compound layer comprises a gallium nitride layer.

16. The manufacturing method according to claim 11, wherein the n trenches are formed in an order from the first trench to the $n^{th}$ trench.

17. The manufacturing method according to claim 11, wherein the n trenches form a staircase structure.

18. The manufacturing method according to claim 11, wherein sidewalls of the n trenches are all perpendicular to a plane where the substrate is located.

19. A semiconductor structure, comprising:
   a substrate; and
   a group compound layer, disposed on the substrate, wherein the III-V group compound layer has n trenches vertically communicating with each other, and $n \geq 2$, wherein widths of the n trenches gradually decrease from the width of the uppermost first trench to the width of the lowermost $n^{th}$ trench, the n trenches have a total depth D, and a depth of each of the n trenches is within a range of $D/n \pm 50\%$.

* * * * *